United States Patent
Xu et al.

(10) Patent No.: US 9,123,541 B2
(45) Date of Patent: Sep. 1, 2015

(54) HIGHLY ETCH-RESISTANT POLYMER BLOCK FOR USE IN BLOCK COPOLYMERS FOR DIRECTED SELF-ASSEMBLY

(71) Applicant: Brewer Science Inc., Rolla, MO (US)

(72) Inventors: Kui Xu, Rolla, MO (US); Mary Ann Hockey, Rolla, MO (US); Douglas Guerrero, Rolla, MO (US)

(73) Assignee: Brewer Science Inc., Rolla, MO (US)

(*) Notice: Subject to any disclaimer, the term of this patent is extended or adjusted under 35 U.S.C. 154(b) by 0 days.

(21) Appl. No.: 14/242,551

(22) Filed: Apr. 1, 2014

(65) Prior Publication Data

US 2014/0299969 A1    Oct. 9, 2014

Related U.S. Application Data

(60) Provisional application No. 61/808,094, filed on Apr. 3, 2013.

(51) Int. Cl.
| | | |
|---|---|---|
| *H01L 21/302* | (2006.01) | |
| *H01L 21/308* | (2006.01) | |
| *H01L 21/033* | (2006.01) | |
| *H01L 21/311* | (2006.01) | |
| *C08L 33/12* | (2006.01) | |

(52) U.S. Cl.
CPC ............ *H01L 21/0331* (2013.01); *C08L 33/12* (2013.01); *H01L 21/0337* (2013.01); *H01L 21/31133* (2013.01); *H01L 21/31138* (2013.01)

(58) Field of Classification Search
CPC ............ G03F 7/0002; C08F 299/0407; C08F 299/0478
USPC ............ 430/270.1, 325; 427/384, 385.5; 438/703–706; 525/50, 71, 89
See application file for complete search history.

(56) References Cited

U.S. PATENT DOCUMENTS

| 7,964,107 | B2 | 6/2011 | Millward | |
|---|---|---|---|---|
| 8,226,838 | B2* | 7/2012 | Cheng et al. | 216/41 |
| 8,257,908 | B2 | 9/2012 | Sakaguchi et al. | |
| 8,398,868 | B2 | 3/2013 | Cheng et al. | |

(Continued)

FOREIGN PATENT DOCUMENTS

| WO | 2011/068960 A2 | 6/2011 |
|---|---|---|
| WO | 2013/041958 A1 | 3/2013 |

OTHER PUBLICATIONS

Rincon Delgadillo et al., "All track directed self-assembly of block copolymers: process flow and origin of defects," Proc. of SPIE, v. 8323, 83230D-1-83230D-9, 2012.

(Continued)

*Primary Examiner* — Hsien Ming Lee
(74) *Attorney, Agent, or Firm* — Hovey Williams LLP

(57) ABSTRACT

Compositions for directed self-assembly (DSA) patterning techniques are provided. Methods for directed self-assembly are also provided in which a DSA composition comprising a block copolymer is applied to a substrate and then self-assembled to form the desired pattern. The block copolymer includes at least two blocks of differing etch rates, so that one block (e.g., polymethylmethacrylate) is selectively removed during etching. Because the slower etching block (e.g., polystyrene) is modified with an additive to further slow the etch rate of that block, more of the slow etching block remains behind to fully transfer the pattern to underlying layers.

53 Claims, 4 Drawing Sheets

(56) References Cited

U.S. PATENT DOCUMENTS

| | | | |
|---|---|---|---|
| 8,691,925 B2* | 4/2014 | Wu et al. ............... | 526/319 |
| 2008/0020290 A1 | 1/2008 | Hatakeyama et al. | |
| 2008/0251284 A1 | 10/2008 | Colburn et al. | |
| 2009/0297784 A1 | 12/2009 | Xu et al. | |
| 2011/0008956 A1 | 1/2011 | Lee et al. | |
| 2012/0034419 A1 | 2/2012 | Washburn et al. | |
| 2013/0022785 A1 | 1/2013 | Ellison et al. | |
| 2013/0029113 A1 | 1/2013 | Nealey et al. | |
| 2013/0045361 A1 | 2/2013 | Willson et al. | |
| 2013/0078576 A1* | 3/2013 | Wu et al. ............... | 430/296 |
| 2013/0273330 A1 | 10/2013 | Wang et al. | |
| 2014/0273476 A1* | 9/2014 | Cheng et al. ........... | 438/703 |

OTHER PUBLICATIONS

Rathsack et al., "Pattern Scaling with Directed Self Assembly Through Lithography and Etch Process Integration," Proc. of SPIE, v. 8323, 83230B-1-83230B-14, 2012.

Tiron et al., "Pattern density multiplication by direct self assembly of block copolymers: Towards 300mm CMOS requirements," Proc. of SPIE, v. 8323, 83230O-1-83230O-7, 2012.

Tiron et al., "Self-Assembly Patterning: Towards 300mm CMOS Requirements," Litho Extension Symposium, Miami, USA, Oct. 20, 2011.

Hinsberg, Bill, "Introduction to / Status of Directed Self-Assembly," DSA Workshop, Kobe, Japan, 2010 IBM Corporation.

Welander et al., "Rapid Directed Assembly of Block Copolymer Films at Elevated Temperatures," Macromolecules 41 (8), 2759-2761, 2008.

Herr, D., "Directed block copolymer self-assembly for nanoelectronics fabrication," J. Mater. Res., 26 (2), Jan. 28, 2011, 122-139.

Cheng et al., "Dense Self-Assembly on Sparse Chemical Patterns: Rectifying and Multiplying Lithographic Patterns Using Block Copolymers," Advanced Materials, 20, 3155-3158, 2008.

Ruiz et al., "Density Multiplication and Improved Lithography by Directed Block Copolymer Assembly," Science, 321, 936-939, 2008.

Wuister et al., "Lithography assisted self-assembly of contact holes on 300-mm wafer scale," J. Micro/Nanolith. MEMS MOEMS, 11(3), 031304-1-031304-9 (Jul.-Sep. 2012).

Li et al., "Block copolymer patterns and templates," Mater. Today, vol. 9, No. 9, 30-39, Sep. 2006.

Ryu et al., "A Generalized Approach to the Modification of Solid Surfaces," Science, vol. 308, 236-239, Apr. 8, 2005.

Gokan et al., "Dry Etch Resistance of Organic Materials", J. Electrochem. Soc., vol. 130, No. 1, 143-146, Jan. 1983.

Drockenmuller et al., "Covalent Stabilization of Nanostructures: Robust Block Copolymer Templates from Novel Thermoreactive Systems," Journal of Polymer Science: Part A: Polymer Chemistry, 2005, 43, 1028-1037.

Leiston-Belanger et al., "A Thermal and Manufacturable Approach to Stabilized Diblock Copolymer Templates," Macromolecules, 2005, 38, 7676-7683.

So et al., "Styrene 4—Vinylbenzocyclobutene Copolymer for Microelectronic Applications." J. Polym. Sci. Part A: Polym. Chem., 2008, 46: 2799-2806.

Park et al., "Enabling nanotechnology with self assembled block copolymer patterns", Polymer, 2003, 44, 6725-6760.

Liu et al., "Pattern transfer using poly(styrene-block-methyl methacrylate) copolymer films and reactive ion etching", J. Vac. Sci. Technol. B, 2007, 25, 1963-1968.

Nunns et al., "Inorganic block copolymer lithography," Polymer, 54, 1269-1284, 2013.

Bates et al., "Polarity-Switching Top Coats Enable Orientation of Sub—10-nm Block Copolymer Domains," Science, vol. 338, pp. 775-779, Nov. 9, 2012.

Bang et al., "Block Copolymer Nanolithography: Translation of Molecular Level Control to Nanoscale Patterns," Adv. Mater., 21, 4769-4792, 2009.

International Search Report and Written Opinion dated Aug. 22, 2014 in corresponding PCT/US2014/032557 filed on Apr. 1, 2014.

Guerrero et al., "Multifunctional hardmask neutral layer for directed self-assembly (DSA) patterning," Proc. of SPIE, v. 8680, 2013, 9 pages.

* cited by examiner

HIGHLY ETCH-RESISTANT POLYMER BLOCK FOR USE IN BLOCK COPOLYMERS FOR DIRECTED SELF-ASSEMBLY

RELATED APPLICATION

The present application claims the priority benefit of U.S. Provisional Patent Application Ser. No. 61/808,094, filed Apr. 3, 2013, entitled HIGHLY ETCH-RESISTANT POLYMER BLOCK FOR USE IN BLOCK COPOLYMERS FOR DIRECTED SELF-ASSEMBLY, incorporated by reference in its entirety herein.

BACKGROUND OF THE INVENTION

1. Field of the Invention

The present disclosure relates to new block copolymers, directed self-assembly compositions, and methods of directed self-assembly pattern formation in the fabrication of microelectronic structures.

2. Description of the Prior Art

The real resolution limit for single patterning 193 nm immersion scanners is becoming insufficient to keep up with the pace of technology advancement. To keep Moore's law moving forward, non-lithography techniques will become more and more important. Directed self-assembly (DSA) techniques are already capable of forming patterns that are <15 nm. DSA is quickly becoming a front-running technology for forming patterns of <20 nm for integrated circuit (IC) manufacture.

Currently, the use of DSA for generating lines and spaces utilizing conventional polystyrene (PS) and poly(methylmethacrylate) block copolymer (PS-b-PMMA) has shown to be in the critical dimension range of 10-20 nm pitch. A range of methods using both chemoepitaxy and graphoepitaxy pre-patterning process flows have been successful for creating both lines and spaces (lamellae) and contacts (cylinders). In contrast, the resolution limit for single patterning 193 nm immersion scanners is 37 nm for dense lines and spaces and 40 nm for contact openings.

Typical DSA process flows incorporate several layers. DSA of block copolymers (BCPs) typically is performed on an organic, neutral "brush" layer. This brush layer usually consists of a random copolymer of styrene and methyl methacrylate (PS-r-PMMA) that has been cured over a long period of time. The block co-polymer DSA formulations are then coated on top of the brush layer and annealed. The annealing process causes the block co-polymer to arrange itself into alternating organized structures. Optionally, a bottom antireflective coating is used to control reflection control of a pre-pattern. This pre-pattern is often formed by standard photolithography techniques, such as the patterning of a photoresist. Etch block layers are also included under the DSA layers to facilitate the pattern transfer process (a silicon- or metal-containing hardmask (HM) such as $SiO_2$ or TiN). Another etch transfer layer, such as spin-on carbon (SOC), may also be under the HM layer in the DSA stack.

Current DSA process flows utilize BCP DSA formulations that are coated to a thickness of around 200-400 Å and annealed. After successful annealing, one of the blocks can then be etched away with the remaining block used as an etch block for the underlying layers or substrate. In a typical PS-b-PMMA BCP formulation, the PMMA etches faster than PS in dry etch conditions. The PMMA is typically all removed while the PS remains on the substrate. During the PMMA removal step, however, significant thickness loss of PS also occurs. Measurements of remaining PS can be as low as half of the original thickness (i.e. 400 Å thickness of PS is reduced to 200 Å or less). FIG. 1 demonstrates this problem. A transfer layer 10 is on a substrate (not shown) or potentially on optional intermediate layers. After a prior art PS-b-PMMA coating is applied and annealed, the assembled PS regions 12 and PMMA regions 14 are formed to create patterned layer 11. Post-annealing, the thickness of patterned layer 11 is typically 20-40 nm. The PMMA regions 14 are then etched (typically dry etching, such as $O_2$ or Ar plasma) to create lines 12 (i.e., the remaining PS region 12) and spaces or contacts 16. The original PS regions 12 experience etching during this process as well, albeit more slowly than the PMMA regions 14, thus leaving insufficient thickness of the lines 12 for the remaining etching that is needed to fully transfer through the transfer layer 10, as shown in FIG. 1(c).

SUMMARY OF THE INVENTION

The present invention overcomes these problems by providing a method of forming a microelectronic structure. The method comprises providing a stack comprising a substrate having a surface, and one or more optional intermediate layers on the substrate surface. A composition is applied to any intermediate layers that are present, or to the substrate surface, if no intermediate layers are present. The composition comprises a block copolymer comprising a first block and a second block, with each of the first and second blocks having respective etch rates. The first block comprises:

a precursor monomer having an etch rate that is slower than the second block etch rate; and at least one etch-adjusting monomer, with the first block having an etch rate that is slower than the precursor monomer etch rate.

The composition is caused to self-assemble into a self-assembled layer. The self-assembled layer comprises a first self-assembled region and a second self-assembled region different from the first self-assembled region.

The invention also provides a microelectronic structure comprising a substrate having a surface, and one or more optional intermediate layers on the substrate surface. The structure further comprises a layer of a self-assembling composition formed on the one or more optional intermediate layers, if present, or on the substrate surface, if no intermediate layers are present. The self-assembling composition comprises a block copolymer dissolved or dispersed in a solvent system, with the block copolymer comprising a first block having an etch rate and a second block having an etch rate. The first block comprises:

a precursor monomer having an etch rate; and at least one etch-adjusting monomer.

The first block has an etch rate that is slower than the precursor monomer etch rate, and the precursor monomer etch rate is slower than the second block etch rate.

In the another embodiment, the invention also provides a microelectronic structure comprising a substrate having a surface, and one or more optional intermediate layers on the substrate surface. The structure further comprises a self-assembled layer formed on the one or more optional intermediate layers, if present, or on the substrate surface, if no intermediate layers are present. The self-assembled layer comprises a first self-assembled region comprising a first block of a block copolymer, and a second self-assembled region different from the first self-assembled region and comprising a second block of the block copolymer. The first block has an etch rate and comprises:

a precursor monomer having an etch rate; and
at least one etch-adjusting monomer, the first block having an etch rate that is slower than the precursor monomer etch rate.

The second block has an etch rate, and the precursor monomer etch rate is slower than the second block etch rate.

The invention further provides a block copolymer comprising a first block and a second block. The first block comprises a monomer selected from the group consisting of styrene, 2-vinylpyridine, 4-vinylpyridine, 4-tert-butyl styrene, and 4-vinylanisole; and at least one etch-adjusting monomer selected from the group consisting of vinylbenzocyclobutene, 1-vinylnaphthalate, 2-vinylnapthalate, 2-vinylanthracene, 9-vinylanthracene, 9-vinylphenanthrene, 4-trimethylsilylstyrene, and combinations thereof. The second block comprises a monomer selected from the group consisting of methyl methacrylate, lactic acid, ethylene oxide, methyl acrylate, vinyl ester, and vinyl amide.

Finally, the invention is also directed towards a composition comprising a block copolymer dissolved or dispersed in a solvent system. The block copolymer comprises a first block and a second block. The first block comprises a monomer selected from the group consisting of styrene, 2-vinylpyridine, 4-vinylpyridine, 4-tert-butyl styrene, and 4-vinylanisole; and at least one etch-adjusting monomer selected from the group consisting of vinylbenzocyclobutene, 1-vinylnaphthalate, 2-vinylnapthalate, 2-vinylanthracene, 9-vinylanthracene, 9-vinylphenanthrene, 4-trimethylsilylstyrene, and combinations thereof. The second block comprises a monomer selected from the group consisting of methyl methacrylate, lactic acid, ethylene oxide, methyl acrylate, vinyl ester, and vinyl amide.

DETAILED DESCRIPTION OF THE PREFERRED EMBODIMENTS

Inventive Polymers

Figure 1:
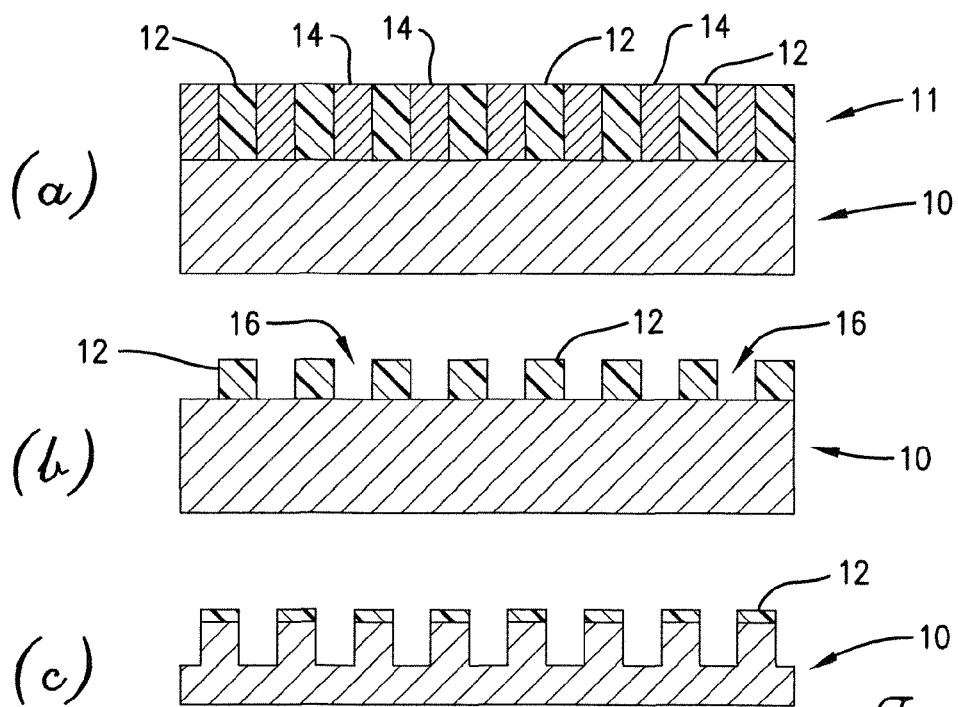
FIG. 1(a)-1(c) is a schematic depicting the problem present in prior art DSA processes.

Compositions for use in the present invention are modified DSA compositions and include a block copolymer (typically a diblock copolymer) dissolved or dispersed in a solvent system. In general, DSA compositions contain two or more immiscible compounds (e.g., polymer blends) or a self-assembling compound comprising at least two components having distinct (and often opposite) characteristics, such as functionality, polarity, or water affinity, etch resistance, etc., which allow segregation (essentially nanophase separation) and alignment of the two compounds or components in a rational manner, as well as selective removal of one compound or component. Block copolymers, as noted above, are particularly well-suited to DSA techniques, as they can be synthesized containing at least two distinct blocks, allowing for each component to align under appropriate conditions, and to be selectively removed after alignment.

Suitable block copolymers for use in the present invention should contain two or more blocks of polymers that self-assemble at the appropriate time (e.g., when annealed), where each block has a different etch rate. This variation could involve a difference in dry etch rates in a variety of etch gases, a difference in wet etch rates in various solvents or other chemicals, or any other difference that would allow one block to be preferentially removed, leaving the second block behind. For example, in some embodiments, the DSA composition comprises a block copolymer comprising at least one block having a low, or slow, etch rate in $O_2$ gas, and at least a second block having a high, or fast, etch rate in $O_2$ gas.

The first block of the polymer includes any monomer that has conventionally been included in the slower etch rate (i.e., higher etch resistance) block in conventional DSA compositions. Examples of such monomers (referred to as precursor monomers, herein) include those selected from the group consisting of styrene, 2-vinylpyridine, 4-vinylpyridine, 4-tert-butyl styrene, and 4-vinylanisole.

This first block is modified with an additive or etch-adjusting monomer. This monomer is selected so that it slows the etch rate of the first block even further. It will be appreciated that this improves the first block's performance as an etch block to transfer a pattern formed in the DSA layer to the underlying layers. This alteration can be the addition of any compound, monomer, etc., that will increase the etch rate of the first block, including the addition of inorganic or organic materials. Particularly preferred etch-adjusting monomer include those able to self-crosslink exposure to heat or light after the block copolymer is patterned, such as etch-adjusting monomers that include fewer heteroatoms, and additives that comprise rings or other cyclic structures. Examples of suitable etch-adjusting monomers include those selected from the group consisting of vinylbenzocyclobutene (VBCB), 1-vinylnaphthalate, 2-vinylnapthalate, 2-vinylanthracene, 9-vinylanthracene, 9-vinylphenanthrene, 4-trimethylsilylstyrene, and combinations thereof. The following schematics show the most preferred precursor monomer (styrene) with some preferred etch-adjusting monomers.

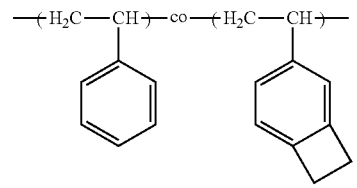

Copolymer of styrene and 4-vinylbenzocyclobutene

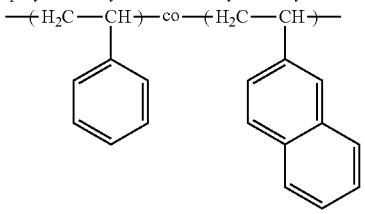

Copolymer of styrene and 2-vinylnaphthalene

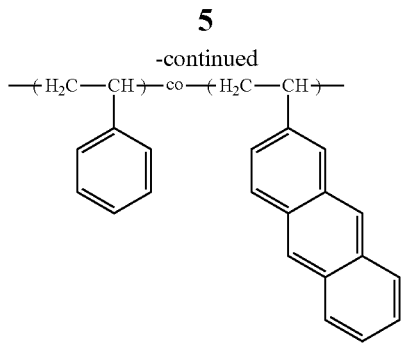

Copolymer of styrene and 2-vinylanthracene

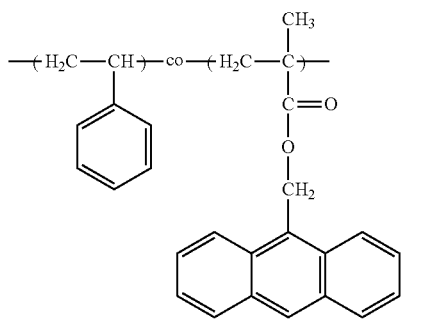

Copolymer of styrene and 9-anthracene methyl methacrylate

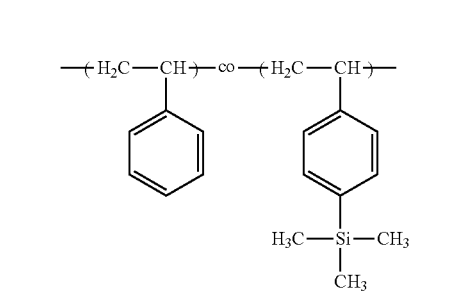

Copolymer of stryene and 4-trimethylsilylstyrene

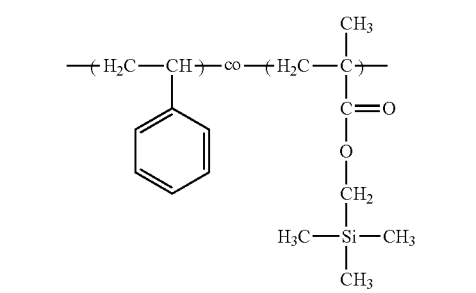

Copolymer of styrene and methacryloxymethyltrimethysilane

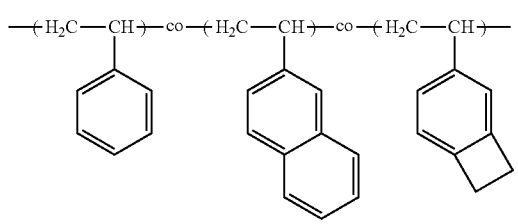

Terpolymer of styrene, 2-vinylnaphthalene, and 4-vinylbenzocyclobutene

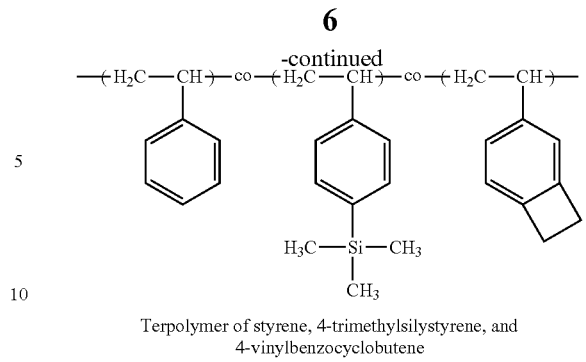

Terpolymer of styrene, 4-trimethylsilylstyrene, and 4-vinylbenzocyclobutene

The molar ratio of precursor monomer to etch-adjusting monomer in the first block can be adjusted, depending upon the application, but it will typically be from about 90:10 to about 10:90, more preferably from about 90:10 to about 30:70, and even more preferably from about 50:50 to about 30:70.

Polymerization Methods

Suitable etch-resistant polymer blocks can be created by using reversible-deactivation radical polymerization techniques, such as reversible addition fragmentation chain transfer (RAFT), atom transfer radical polymerization (ATRP), stable free radical mediated polymerization (SFRP), etc. The following schematic shows a general reaction of using RAFT polymerization to create a random copolymer.

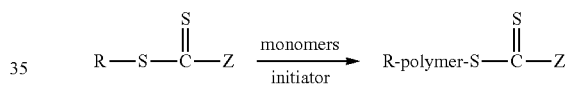

General Reaction Methodology of RAFT to Create Random Polymers

A typical RAFT polymerization uses a radical initiator, a chain transfer agent (e.g., thiocarbonylthio compounds), the selected monomers, and a solvent. The polymerization reaction is performed at a suitable temperature in an oxygen-free environment, and then is stopped at a point suitable to generate polymers with a well-controlled molecular weight.

While the above described polymerization methods for forming the first block, the final block copolymers (which would include the above-described first block) can also be created by using reversible-deactivation radical polymerization techniques, such as RAFT, ATRP, SFRP, etc. This schematic shows a general reaction of using RAFT polymerization to create a block copolymer.

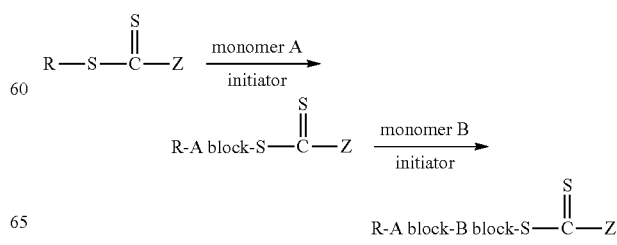

General Reaction Methodology of RAFT to Create Block Polymers

The process to create a block copolymer utilizes a two-step reaction. First, a monomer (monomer A above) is polymerized via RAFT polymerization in the presence of a radical initiator and a chain transfer agent (e.g., thiocarbonylthio compounds) to generate a polymer (polymer A above) with a chain transfer agent moiety (e.g., thiocarbonylthio) at one chain end. The obtained polymer is then used as a macromolecular chain transfer agent in the second reaction, to effectuate the polymerization of a second monomer (monomer B above) in the presence of a radical initiator to generate the block copolymer (A-B above).

Suitable radical initiators for use in RAFT polymerization method include those selected from the group consisting of 2,2'-azobis(2-methylpropionitrile) (AIBN), 4,4'-azobis(4-cyanovaleric acid) (ACVA), and 1,1'-azobis(cyclohexanecarbonitrile) (ACHN).

Suitable chain transfer agents include those selected from the group consisting of 2-cyano-2-propyl benzodithioate, 2-phenyl-2-propyl benzodithioate, 4-cyano-4-(phenylcarbonothioylthio)pentanoic acid, 2-cyano-2-propyl dodecyl trithiocarbonate, and 4-cyano-4-[(dodecylsulfanylthiocarbonyl)sulfanyl]pentanoic acid.

Suitable solvents include those selected from the group consisting of toluene, 1,4-dioxane, tetrahydrofuran, and anisole.

In a preferred embodiment, a P(S-VBCB)-b-PMMA block copolymer can be synthesized by using functionalized PMMA as a chain transfer agent, AIBN as the initiator, and a mixture of styrene and vinylbenzocyclobutene (VBCB) as the monomer.

Poly(styrene-co-2-vinylbenzocyclobutene-b-poly(methyl methacrylate) block copolymers (P(S-VBCB)-b-PMMA) are one example of DSA materials suitable for use in the invention. These block copolymer molecules generally comprise a string of PS-VBCB linked to a string of PMMA. Exemplary structures of other block copolymers formed by such additions are shown below.

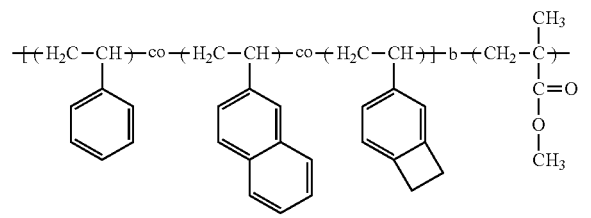

Block copolymer of poly(styrene-co-2-vinylnaphthalene-co-4-vinylbenzocyclobutene)-b-poly(methyl methacrylate)

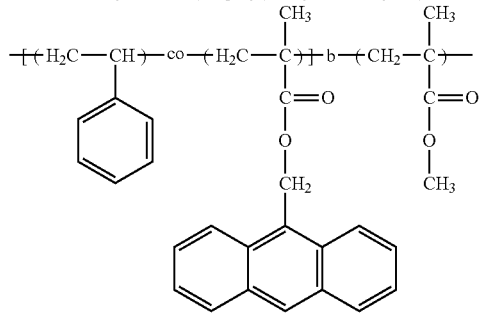

Block copolymer of poly(styrene-co-9-antracene methyl methacrylate)-b-poly(methyl methacrylate)

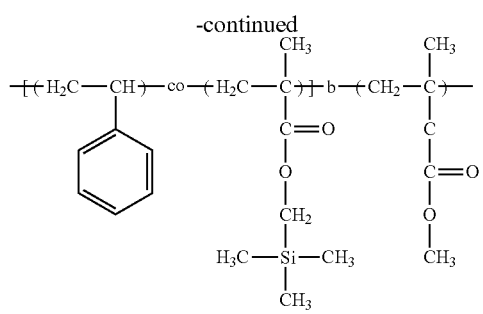

Block copolymer of poly(styrene-co-methacryloxymethyltrimethylsilane)-b-poly(methyl methacrylate)

While a polymer formed of methyl methacrylate monomers (i.e., PMMA) is the most preferred second block, other second blocks could also be utilized, including those selected from the group consisting of polymers comprising monomers selected from the group consisting of lactic acid, ethylene oxide, vinyl esters, vinyl amides, and methyl acrylate.

The final block copolymer will typically have a weight average molecular weight of from about 1,000 Da to about 100,000 Da, preferably from about 5,000 Da to about 50,000 Da, and more preferably from about 10,000 Da to about 40,000 Da. Additionally, the molar ratio of first block to second block will typically be from about 90:10 to about 10:90, more preferably from about 70:30 to about 30:70, and even more preferably from about 60:40 to about 40:60.

Inventive Composition

In addition to the block copolymer as described above, the inventive compositions can include a number of optional ingredients, such as those selected from the group consisting of surfactants, acid catalysts, base catalysts, crosslinkers, and mixtures thereof. The DSA compositions are prepared by dissolving or dispersing the above-described block copolymer in a solvent system. Suitable solvents include those selected from the group consisting of propylene glycol monomethyl ether (PGME), propylene glycol monomethyl ether acetate (PGMEA), gamma-butyrolactone (GBL), cyclohexanone, cyclopentanone, ethyl lactate (EL), ethylactoacetate (EAA), n-butyl acetate, methyl isobutyl carbinol (MIBC), 2-heptanone, isopropyl alcohol (IPA), methyl ethyl ketone (MEK), and mixtures thereof.

Preferred compositions will preferably have solids content of from about 0.1% by weight to about 5% by weight, more preferably from about 0.1% by weight to about 2% by weight, and even more preferably from about 0.1% by weight to about 1% by weight, based upon the total weight of the composition taken as 100% by weight. The amount of block copolymer in the composition will generally fall within the above ranges as well, since it is most likely the primary (and possibly only) solid present in the composition.

Methods of Using Inventive Compositions

The inventive DSA layer can be formed from the above-described compositions by any known application method, with some of those methods being described in U.S. patent application Ser. No. 13/862,720, the entirety of which is incorporated by reference herein. One preferred method involves spin-coating the block copolymer composition onto a substrate at speeds from about 500 rpm to about 2,500 rpm, preferably from about 1,000 rpm to about 1,500 rpm, for a time period of from about 30 seconds to about 90 seconds, preferably from about 50 seconds to about 60 seconds.

After the block copolymer composition is applied, self-assembly can be carried out using any suitable technique, including thermal annealing, solvent annealing, microwave annealing, and combinations thereof. In a preferred embodiment, thermal annealing is carried out by heating the layer to a temperature above its glass transition temperature (Tg). That temperature would typically be from about 100° C. to about 300° C., and more preferably from about 110° C. to about 250° C., for a time period of from about 30 seconds to about 600 seconds, and preferably from about 60 seconds to about 120 seconds, in order to anneal the material and form the DSA layer. The thickness of the DSA layer after baking is preferably from about 20 nm to about 60 nm, and more preferably from about 30 nm to about 40 nm, depending upon the molecular weight of each polymer block.

In one embodiment, the self-assembly is carried out right after the DSA composition is applied. In other words, there aren't any additional layers or other compositions applied on top of the DSA layer, as is the case in some prior art methods.

As noted above, the first and second blocks of the DSA layer will have different etch rates. Thus, the more etch-resistant material (i.e, the first block) will have an etch rate of less than about 20 nm/min, preferably less than about 16 nm/min, more preferably less than about 12 nm/min, and even more preferably from about 3 nm/min to about 12 nm/min, in an oxygen-rich plasma etch atmosphere. The less etch-resistant material (i.e., the second block) will have an etch rate of at least about 18 nm/min, preferably at least about 20 nm/min, more preferably at least about 22 nm/min, and even more preferably from about 22 nm/min to about 50 nm/min, in an oxygen-rich plasma etch atmosphere.

Preferably, the second block (i.e., least etch-resistant material, such as PMMA) should etch at least about twice as fast as the first block (i.e., the most etch-resistant material, such as P(S-VBCB)). In other words, the etch rate of the second block is at least about twice the etch rate of the first block. Furthermore, the second block preferably etches at least about 3 times faster than the first block, and more preferably from about 3 times faster to about 10 times faster, in an oxygen-rich plasma etch atmosphere.

The second block should etch at least about 1.5 times faster than the precursor monomer (i.e., the etch rate of the second block is at least about twice the etch rate of the precursor monomer), preferably at least about 1.8 times faster, and more preferably from about 1.8 times faster to about 2 times faster, in an oxygen-rich plasma etch atmosphere. Finally, the precursor monomer should etch at least about 1.1 times faster than the first block (i.e., the etch rate of the precursor monomer is at least about twice the etch rate of the first block), preferably at least about 1.5 times faster, and more preferably from about 2 times faster to about 5 times faster, in an oxygen-rich plasma etch atmosphere. Each of these rates can be achieved with other etchants as well, including those selected from the group consisting of $O_2$/Ar and Ar.

The DSA layer can optionally be coated on top of a series of one or more underlayers selected from the group comprising bottom anti-reflective coatings, neutral brush layers, hardmask neutral layers (HM NL), hardmasks, spin-on carbon, or other layers. In some cases, a single layer, such as an HM NL, can perform the function of multiple layers, such as those of the bottom anti-reflective coatings, the neutral brush layer and the hardmask.

One optional intermediate layer is a hardmask layer. A hardmask layer can be formed by any known application method, with one preferred method being spin-coating at speeds from about 1,000 to about 5,000 rpm, and preferably from about 1,250 rpm to about 1,750 rpm, for a time period of from about 30 to about 120 seconds, and preferably from about 45 seconds to about 75 seconds. Suitable hardmask layers are preferably high-silicon content materials, such as those selected from the group consisting of silanes, siloxanes, and silsesquioxanes. Exemplary hardmask layers will generally compromise a polymer dissolved or dispersed in a solvent system, optionally along with one or more the following ingredients: surfactants, acid or base catalysts, and crosslinkers.

Preferred hardmask compositions will preferably have solids content of from about 0.1% by weight to about 70% by weight, more preferably from about 0.5% by weight to about 10% by weight, and even more preferably from about 1% by weight to about 2% by weight, based upon the total weight of the hardmask composition taken as 100% by weight. After the hardmask is applied, it is preferably heated to a temperature from about 100° C. to about 300° C., and more preferably from about 150° C. to about 250° C., and for a time period of from about 30 seconds to about 120 seconds, and preferably from about 45 seconds to about 60 seconds, to evaporate solvents. The thickness of the hardmask layer after baking is preferably from about 5 nm to about 50,000 nm, more preferably from about 5 nm to about 1,000 nm, and even more preferably from about 10 nm to about 100 nm. The hardmask layer should have an etch rate at least 0.75 times that of the block copolymer in a fluorine-rich plasma atmosphere, and at least 5 times slower than any SOC in an oxygen-rich plasma etch atmosphere. The hardmask thickness should not be affected by the solvent in the DSA composition (i.e., no hardmask stripping). Thus, when subjected to a stripping test, the crosslinked hardmask layer will have a percent stripping of less than about 5%, preferably less than about 1%, and more preferably about 0%. The stripping test involves first determining the thickness by taking the average of measurements at five different locations of the hardmask layer. This is the initial average film thickness. Next, the film is rinsed with a solvent or developer for about 30 seconds, followed by spin drying at about 500-3,000 rpm for about 20-60 seconds to remove the solvent. The thickness is measured again at those five points on the wafer using ellipsometry, and the average of these measurements is determined. This is the average final film thickness. The amount of stripping is the difference between the initial and final average film thicknesses. The percent stripping is:

$$\% \text{ stripping} = \left(\frac{\text{amount of stripping}}{\text{initial average film thickness}}\right) \times 100.$$

While the above lack of stripping is described with respect to hardmask layers, the same would be true for any other intermediate layer included under the inventive DSA layer, including those described above.

Some commercial hardmask layers can be used. Other preferred hardmask layers contain a copolymer of monomers selected from the group containing phenethyltrimethoxysilane (PETMS), 2-(carbomethoxy)ethyltrimethoxysilane (CMETMS), tetraethoxysilane (TEOS), methyltrimethoxysilane, and phenyltrimethoxysilane.

The carbon-rich layer can be formed by any known application method, with one preferred method being spin-coating at speeds from about 1,000 rpm to about 5,000 rpm, and preferably from about 1,250 rpm to about 1,750 rpm, for a time period of from about 30 seconds to about 120 seconds, and preferably from about 45 seconds to about 75 seconds. The term "carbon-rich" refers to layers formed from compositions comprising greater than about 50% by weight carbon, preferably greater than about 70% by weight carbon, and more preferably from about 75% to about 80% by weight carbon, based upon the total solids in the carbon-rich composition taken as 100% by weight. Suitable carbon-rich layers are selected from the group consisting of spin-on carbon layers (SOC), amorphous carbon layers, and carbon planarizing layers.

Exemplary carbon-rich layers will generally compromise a polymer dissolved or dispersed in a solvent system, along with one or more of the following optional ingredients: acid and/or base quenchers, catalysts, crosslinking agents, and surface modification additives. Preferred compositions will be suitable for forming thick layers and preferably have solids content of from about 0.1% by weight to about 70% by weight, more preferably from about 5% by weight to about 40% by weight, and even more preferably from about 10% by weight to about 30% by weight, based upon the total weight of the carbon-rich composition taken as 100% by weight. After the carbon-rich composition is applied, it's preferably heated to a temperature from about 100° C. to about 300° C., and more preferably from about 160° C. to about 250° C., and for a time period of from about 30 seconds to about 120 seconds, and preferably from about 45 seconds to about 60 seconds, to evaporate solvents. The thickness of the carbon-rich layer after baking is preferably from about 10 nm to about 50,000 nm, more preferably from about 100 nm to about 5,000 nm, and even more preferably from about 500 nm to about 1,500 nm.

The substrate to which the DSA layer is applied is preferably a semiconductor substrate, such as those selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing. Again, optional intermediate layers may be formed on the substrate prior to processing. These include those selected from the group consisting of bottom anti-reflective coatings, neutral brush layers, hardmask neutral layers, hardmasks, spin-on carbon layers, etch block layers, and imaging layers.

Figure 2:
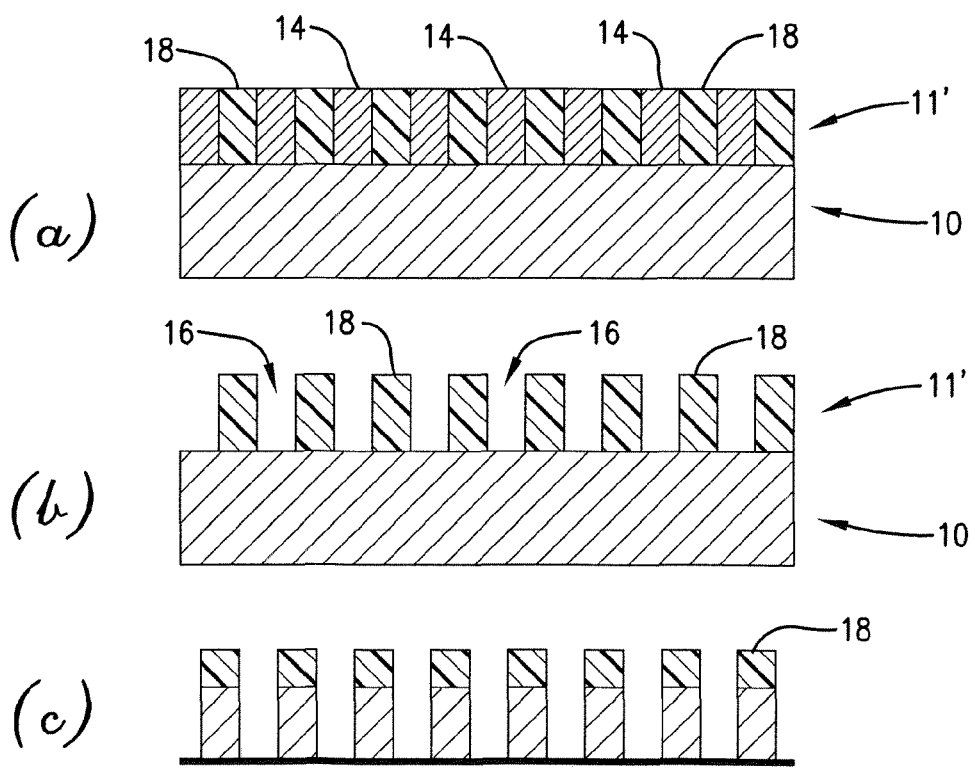
FIG. 2(a)-2(c) is a schematic depicting the results achieved by the inventive method.

Referring to FIG. 2, a comparison can be made between the differences achieved by the invention as opposed to the prior art discussed with reference to FIG. 1. In FIG. 2, similar parts from FIG. 1 are numbered the same. However, in this instance, the inventive composition creates assembled first block or PS regions 18, which have an even slower etch rate than the PS regions 12 achieved by the prior art in FIG. 1. Thus, referring to FIG. 2(b), after etching of the second block or PMMA regions 14, sufficient PS regions 18 remain behind that the pattern 11' can be fully transferred through the transfer layer 10, as shown in FIG. 2(c). It will be appreciated that the pattern 11' could also be transferred into one or more intermediate layers, if present, as well as into the substrate (e.g., the microelectronic substrate). The pattern 11' will typically be comprised of features such as trenches, spaces, via holes, and/or contact holes in the annealed DSA layer. Advantageously, these features will have an average (mean) respective feature size of less than about 30 nm, and preferably less than about 20 nm. The term "feature size," as used herein, refers to the average (mean) width of the features as measured on an SEM cross-section of the stack (thus in the case of holes the width is the same as the hole diameter).

While the above describes a preferred embodiment, it will be appreciated that there are a number of variations that could be carried out. These variations are described and shown in detail in U.S. patent application Ser. No. 13/862,720, previously incorporated by reference. For example, the invention could be utilized in lithography-assisted (e.g., graphoepitaxy) self-assembly. In summary, a stack is prepared as described above, using a substrate, optional intermediate layer (e.g., carbon-rich layer), and hardmask layer. An imaging layer is formed on the cured hardmask layer following conventional methods. Suitable photosensitive compositions for use as the imaging layer include any composition that can be patterned upon exposure to at least about 1 $mJ/cm^2$ radiation, such as photoresists, anti-reflective imaging layers, and the like. The imaging layer can then be post-application baked ("PAB") at a temperature of at least about 80° C., and preferably from about 100° C. to about 140° C., for time periods of from about 10 seconds to about 120 seconds (preferably from about 30 seconds to about 60 seconds). The thickness of the imaging layer is preferably from about 10 nm to about 300 nm, more preferably from about 20 nm to about 150 nm, and even more preferably from about 30 nm to about 100 nm.

That imaging layer can then be patterned, for example, by exposure to radiation (e.g., light in the case of optical lithography) of the appropriate wavelength, followed by development of the unexposed portions of the imaging layer, again following conventional methods. For example, the imaging layer could be exposed using a mask positioned above the imaging layer. The mask has open areas designed to permit radiation (hv) to pass through the mask and contact the imaging layer to yield exposed portions of the imaging layer that are rendered insoluble in solvent (when using a negative-tone photoresist). The remaining solid portions of the mask are designed to prevent radiation from contacting the imaging layer in certain areas to yield unexposed portions of the imaging layer that remain solvent soluble. Those skilled in the art will readily understand that the arrangement of open areas and solid portions is designed based upon the desired pattern to be formed in the imaging layer, although the present method is particularly suited for dark-field exposure where the majority of the imaging layer is shielded from radiation to form raised features such as lines and pillars. After exposure, the imaging layer is preferably subjected to a post-exposure bake ("PEB") at a temperature of from about 80° C. to about 150° C., more preferably from about 100° C. to about 130° C., for a time period of from about 30 seconds to about 60 seconds.

Upon exposure, the portions of the imaging layer that are exposed to radiation are rendered insoluble in organic (preferably non-alkaline) solvent developer. The exposed imaging layer is then contacted with solvent to remove the unexposed portions to form the desired "pre-pattern" in the imaging layer. Alternatively, when using a positive-tone photoresist, the exposed portions of the imaging layer can be rendered soluble in aqueous developer (e.g., an alkaline developer) or solvent during the exposure process, in which case, the removal process is reversed from what is described above. That is, the exposed portions are removed during development to form the pattern (not shown). In either embodiment, at least about 95% of the unexposed (or exposed, as the case may be) portions of the imaging layer 22 will preferably be removed by developer, more preferably at least about 99%, and even more preferably about 100% will be removed. Suitable non-alkaline solvent developers include n-butyl acetate, n-butyl propionate, isobutyl butyrate, and/or ketones (e.g., 2-heptanone). Suitable alkaline developers for positive-tone imaging layers are organic or inorganic alkaline solutions such as potassium hydroxide (KOH) and tetramethyl ammonium hydroxide (TMAH), and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan).

Thus, pre-pattern formation results in portions of the hardmask layer underneath the imaging layer being uncovered or exposed when those selected portions of the imaging layer are removed from the stack. The resulting pre-pattern preferably comprises raised features (e.g., lines, pillars, square islands, or combinations thereof) formed on the hardmask layer. These features are chemically identical to the exposed portions of the imaging layer, and are each defined by respective sidewalls and respective top surfaces. It will be appreciated that in alternative embodiments, any other suitable patterning process may be used to pattern the imaging layer and form raised features, including multiple patterning processes, as well as immersion lithography. As mentioned above, it will also be appreciated that a positive-tone resist or photosensitive material could also be used, instead of the negative-tone imaging layer described herein. In that case, the unexposed portions of the imaging layer remain insoluble, while the exposed portions are rendered soluble and are removed with developer. Other patterning methods may also be used, including emerging technologies, such as imprint lithography, nano-imprint lithography, hot embossing lithography, and stamping pattern transfer. These technologies use a patterned mold to transfer patterns instead of relying on photolithographic patterning, as described above.

Regardless of the embodiment, once the desired pre-pattern is formed, a DSA composition according to the invention can be applied to the patterned stack, such that it flows into the spaces between the raised features (i.e., directly adjacent the hardmask), and adjacent the sidewalls of the raised features. In one or more embodiments, the self-assembling composition can also overcoat the top surfaces of the raised features. However, in other embodiments, the self-assembling composition preferably does not overcoat the top of the raised features. In other words, the self-assembling composition is deposited between the raised features and adjacent the feature sidewalls, but is absent from the top surfaces of the raised features. As a result, the top surface of the raised features remain open to be easily removed via solvent removal or etching, without the need for an etch-back step or other modification of the self-assembling layer to expose the pre-pattern.

The DSA composition can then be self-assembled or annealed as described above to yield first self-assembled regions and second self-assembled regions in the self-assembled or annealed layer, with one of the first or second self-assembled regions being adjacent the raised feature sidewalls, and the other of the first or second self-assembled regions segregated away from the raised features. For example, in the case of P(S-VBCB)-b-PMMA block copolymer composition, the polystrene-VBCB blocks would align adjacent to the photoresist sidewalls, while the PMMA blocks are drawn towards each other and are segregated between adjacent self-assembled regions of polystrene-VBCB.

Either of the first or second self-assembled regions can then be removed to generate a pattern. For example, the first self-assembled region can then be removed to generate a pattern in the DSA layer on the patterned stack, followed by transferring this pattern down into the hardmask and carbon-rich intermediate layer. It will be appreciated that instead of the first self-assembled region, the second self-assembled region could be removed instead. Regardless, the resulting pattern is eventually transferred down into the substrate.

One advantage of the present invention is that, in embodiments where a hardmask neutral layer is utilized, the surface properties of that layer can be modified from a neutral layer that will facilitate aligning of the self-assembling materials to a non-alignment layer over which the self-assembling materials will not align during annealing or self-assembly. One possible avenue for modifying the hardmask layer involves chemoepitaxy. A stack is prepared comprising a substrate, optional intermediate layer, hardmask neutral layer, and imaging layer, as described above. A pre-pattern is created in the imaging layer, either using the method described previously, or any other conventional method. Thus, pre-pattern formation results in portions of the hardmask layer underneath the imaging layer being uncovered or exposed when those selected portions of the imaging layer are removed from the stack. The remaining portions of the imaging layer adjacent the hardmask serve as a mask for surface modification of the hardmask neutral layer. In one or more embodiments, the imaging layer is patterned using optical lithography and a developer (e.g., alkaline developer) or solvent rinse. Alternatively, the imaging layer is patterned using another suitable method, followed by contact with a developer solution (e.g., alkaline developer) or solvent. Regardless, the exposed portions of the hardmask layer are contacted with a developer solution (separately or during developer rinse). The remaining portions of the imaging layer are then removed (e.g., with solvent), yielding the hardmask layer having surface-modified regions and non-modified regions, where the surface-modified regions correspond to those portions of the hardmask that were uncovered during patterning of the imaging layer. Advantageously, contact with the developer (and particularly with an alkaline developer) changes the surface energy of the hardmask layer. In one or more embodiments, the surface energy is increased and causes the surface-modified regions of the hardmask to lose their ability to act as a neutral layer and induce alignment during the self-assembly process. However, the non-modified regions of the hardmask, which remained covered by the imaging layer during patterning and developer contact, still retain their neutral layer properties. Thus, the surface-modified regions correspond to non-aligning areas while the non-modified regions correspond to aligning areas on the hardmask. The active aligning areas therefore have the ability to become guiding structures for pattern formation during self-assembly.

A DSA layer is then formed directly on top of the surface-modified hardmask layer, such that there is direct contact between the DSA layer and surface-modified regions and non-modified regions. The DSA layer is then self-assembled as described above to allow the components to self-assemble. Because of the surface modification, the self-assembling layer will only self assemble into first self-assembled regions and second self-assembled regions in those portions of the DSA layer that are adjacent the non-modified areas of the hardmask. In other words, portions of the DSA layer adjacent the surface-modified areas of the hardmask do not separate or segregate into a pattern during annealing or self-assembly and are "unassembled" or "non-aligned." One of the first or second self-assembled regions can then be selectively removed, followed by etching the resulting pattern into the hardmask layer and optional intermediate layer. This pattern is eventually transferred down into the substrate.

It will be appreciated that in each of the foregoing methods, self-assembly or annealing results in nanophase separation in the DSA layer, which permits the formation of nanometer-sized patterns generally not achievable using conventional optical lithography techniques. It will also be appreciated that although the present methods illustrate formation of at least two distinct annealed or self-assembled regions in the DSA layer, it is envisioned that additional DSA materials could be formulated that are capable of separation into more than two distinct phases, including third and fourth annealed or self-assembled regions.

EXAMPLES

The following examples set forth preferred methods in accordance with the invention. It is to be understood, however, that these examples are provided by way of illustration and nothing therein should be taken as a limitation upon the overall scope of the invention.

Example 1

Synthesis of Poly(styrene-co-4-vinylbenzocyclobutene)

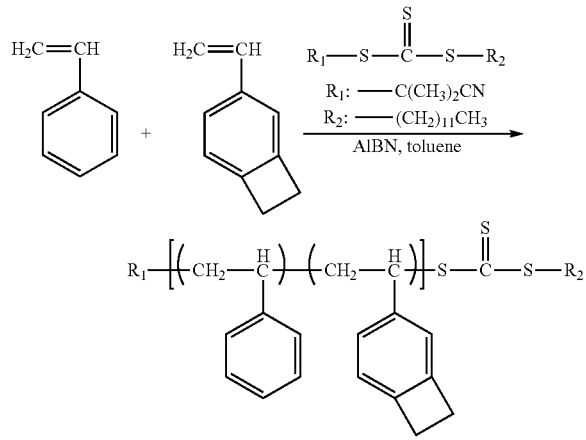

Synthesis of Poly(styrene-co-4-vinylbenzocyclobutene) (P(S-VBCB))

A solution of 3.4 grams of styrene (Sigma-Aldrich, St. Louis, Mo.), 3.5 grams of 4-vinylbenzocyclobutene (VBCB) (Sigma-Aldrich, St. Louis, Mo.), and 4.1 milligrams of 2,2'-azobis(2-methylpropionitrile) (AIBN) (Sigma-Aldrich, St. Louis, Mo.) in 2 mL of toluene (Sigma-Aldrich, St. Louis, Mo.) was prepared in a 50-milliliter flask and stirred at room temperature for 15 minutes under nitrogen atmosphere. The solution was then transferred into a 50-milliliter Schlenk reaction flask containing 27.2 miligrams of 2-cyano-2-propyl dodecyl trithiocarbonate (Sigma-Aldrich, St. Louis, Mo.). The reaction mixture in the Schlenk reaction flask was then de-gassed by three repeated freeze-evacuate-thaw cycles and sealed in vacuum. The Schlenk reaction flask was put in a heated oil bath (96° C.) for 17 hours. The viscous reaction mixture obtained was diluted with 20 mL of dichloromethane (Sigma-Aldrich, St. Louis, Mo.) and precipitated into 400 mL of methanol (Sigma-Aldrich, St. Louis, Mo.). The solid polymer product was collected by filtration and then dried in vacuum over at 40° C. for 12 hours. GPC analysis of the obtained P(S-VBCB) polymer revealed: Mn=19,100; Mw=26,500; PDI=1.30.

Example 2

Crosslinking and Etch Rate Validation of Poly(styrene-co-4-vinylbenzocyclobutene)

The poly(styrene-co-4-vinylbenzocyclobutene) (P(S-VBCB)) random copolymer from Example 1 was tested to validate that the modifications to the chemical structure of the PS block were able to be crosslinked successfully using heat. Six 150-mm silicon wafers were coated with the P(S-VBCB) using a spin speed of 1,500 rpm for 60 seconds and baked on a hot plate with temperatures varying from 200° C. to 250° C. in increments of 10° C., yielding a film thickness of about 250 Å. Initial thickness measurements were taken using a J.A. Woollam M2000 VUV-VASE tool. Wafers then were subjected to a static dispense of PGMEA (Ultra Pure Solutions, Inc., Castroville, Calif.) for 1 minute and then remeasured to analyze the amount of thickness loss. If the material was fully crosslinked, there would be minimal thickness loss. The results shown in Table 1 indicate that successful thermal crosslinking occurs at 240-250° C. for this random copolymer.

TABLE 1

Thickness loss for the P(S-VBCB) copolymer

| Temperature | Initial Thickness | Post PGMEA Strip (60 sec) | Total Thickness Loss | % Loss |
| --- | --- | --- | --- | --- |
| 200° C. | 249 Å | 25 Å | 224 Å | 89.9% |
| 210° C. | 247 Å | 28 Å | 219 Å | 88.6% |
| 220° C. | 246 Å | 42 Å | 204 Å | 82.9% |
| 230° C. | 246 Å | 95 Å | 151 Å | 61.4% |
| 240° C. | 244 Å | 238 Å | 6 Å | 2.5% |
| 250° C. | 244 Å | 244 Å | 0 Å | 0.0% |

Figure 3:
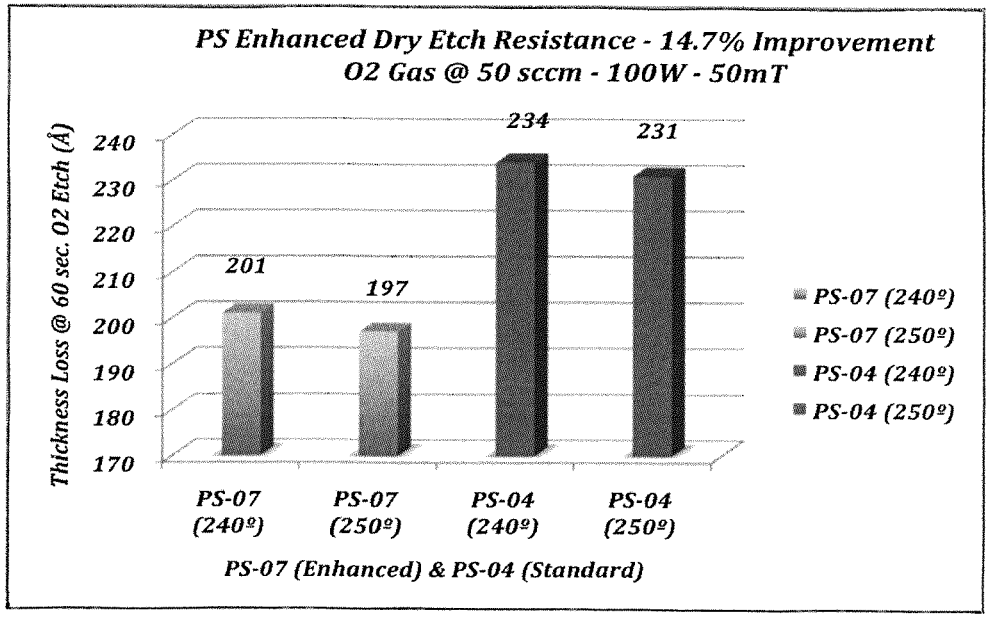
FIG. 3 is a graph depicting the etch rate data in $O_2$ etchant of an inventive DSA composition as compared to a prior art DSA composition, as described in Example 3.

The P(S-VBCB) random copolymer was next tested to validate that modifications to the chemical structure of the PS block improved the dry etch resistance using $O_2$ plasma chemistry. Four 150-mm silicon wafers were coated with P(S-VBCB) using a spin speed of 1,500 rpm for 60 seconds and baked on a hot plate with temperatures at 240° C. and 250° C. yielding a film thickness of about 240 Å. All measurements were taken using a J.A. Woollam M2000 VUV-VASE tool. Wafers then were subjected to dry plasma etch using the Oxford PlasmaLab 80+ RIE etch tool using $O_2$ plasma of 50 sccm at 100 W with 50 mTorr pressure for a total of 60 seconds etch time. The results shown in Table 2, along with those of FIG. 3, indicate a smaller etch thickness loss.

TABLE 2

Etch thickness comparison of P(S-VBCB) and standard PS

| Material | Bake Temp (° C.) | Initial Thickness (Å) | Post Etch Thickness (Å) | Thickness Loss (Å) |
| --- | --- | --- | --- | --- |
| Polystyrene | 240 | 270 | 36 | 234 |
| Polystyrene | 250 | 270.5 | 40 | 230.5 |
| P(S-VBCB) | 240 | 239 | 38 | 201 |
| P(S-VBCB) | 250 | 235 | 38 | 197 |

Example 3

Synthesis of Poly(styrene-co-4-vinylbenzocyclobutene)-b-poly(methyl methacrylate) Block Copolymers

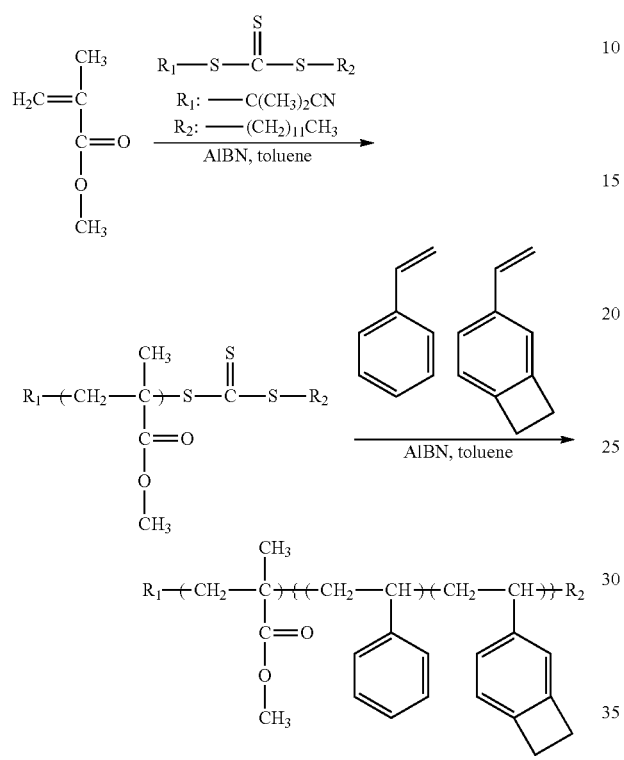

Synthesis of Poly(styrene-co-4-vinylbenzocyclobutene)-b-poly(methyl methacrylate) (P(S-VBCB)-b-PMMA)

The PMMA block was prepared first. A mixed solution of 518 milligrams of 2-cyano-2-propyl dodecyl trithiocarbonate (Sigma-Aldrich, St. Louis, Mo.), 40.0 grams of methyl methacrylate (Sigma-Aldrich, St. Louis, Mo.), and 28 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 27.4 milligrams of 2,2'-azobis(2-methylpropionitrile) (Sigma-Aldrich, St. Louis, Mo.) was added afterwards. The Schlenk reaction flask was de-gassed by three consecutive freeze-evacuate-thaw cycles and sealed in vacuum. The polymerization was carried out at 60° C. for 17 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. GPC analysis of the obtained PMMA with a trithiocarbonate end group revealed: Mn=15, 800; Mw=17, 500; PDI=1.11.

In the following reaction to prepare the P(S-VBCB)-b-PMMA block copolymer, 3.1 grams of PMMA prepared above, 4.4 grams of styrene (Sigma-Aldrich, St. Louis, Mo.), 4.5 grams of 4-vinylbenzocyclobutene (Sigma-Aldrich, St. Louis, Mo.), and 4.0 grams of toluene (Sigma-Aldrich, St. Louis, Mo.) were added into a Schlenk reaction flask and stirred at room temperature for 15 minutes. Next, 4.1 milligrams of 2,2'-azobis(2-methylpropionitrile) (Sigma-Aldrich, St. Louis, Mo.) were added. The Schlenk reaction flask was then de-gassed by three repeated freeze-evacuate-thaw cycles and sealed in vacuum. The polymerization was carried out at 90° C. for 16 hours. The reaction mixture obtained was then diluted with 50 milliliters of dichloromethane (Sigma-Aldrich, St. Louis, Mo.) and precipitated in 0.8 liter of methanol (Sigma-Aldrich, St. Louis, Mo.). The polymer product collected by filtration was further purified by re-dissolving in 50 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours. GPC analysis of the obtained P(S-VBCB)-b-PMMA block copolymer revealed: Mn=24, 300; Mw=30, 100; PDI=1.24.

Example 4

Synthesis of Poly(styrene-co-2-vinylnaphthalene-co-4-vinylbenzocyclobutene)-b-poly(methyl methacrylate) Block Copolymers

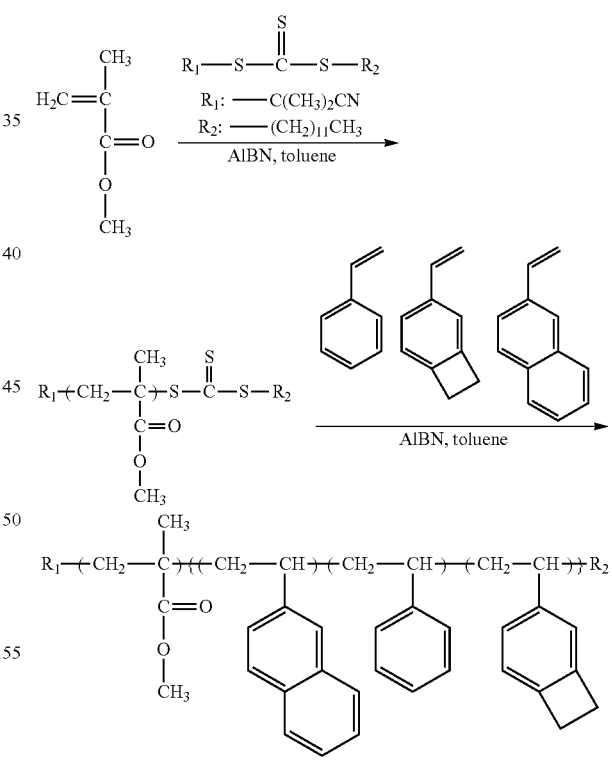

Synthesis of poly(styrene-co-2-vinylnaphthalene-co-4-vinylbenzocyclobutene)-b-poly(methyl methacrylate) (P(S-VN-VBCB)-b-PMMA)

The PMMA block was prepared first. A mixed solution of 279 milligrams of 2-cyano-2-propyl dodecyl trithiocarbonate (Sigma-Aldrich, St. Louis, Mo.), 28.7 gram of methyl methacrylate (Sigma-Aldrich, St. Louis, Mo.), and 28 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 32.4 milligrams of 2,2'-azobis(2-methylpropionitrile) (Sigma-Aldrich, St. Louis, Mo.) were added afterwards. The Schlenk reaction flask was de-gassed by three consecutive freeze-evacuate-thaw cycles and sealed in vacuum. The polymerization was carried out at 60° C. for 15 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. GPC analysis of the obtained PMMA with a trithiocarbonate end group revealed: Mn=22, 300; Mw=24, 800; PDI=1.11.

In the following reaction to prepare the P(S-VN-VBCB)-b-PMMA block copolymer, 3.3 grams of PMMA prepared above, 5.05 grams of styrene (Sigma-Aldrich, St. Louis, Mo.), 1.70 grams of 4-vinylbenzocyclobutene (Sigma-Aldrich, St. Louis, Mo.), 1.99 grams of 2-vinylnaphthalene (Sigma-Aldrich, St. Louis, Mo.), and 4.5 grams of toluene (Sigma-Aldrich, St. Louis, Mo.) were added into a Schlenk reaction flask and stirred at room temperature for 15 minutes. Next, 4.5 milligrams of 2,2'-azobis(2-methylpropionitrile) (Sigma-Aldrich, St. Louis, Mo.) were added. The Schlenk reaction flask was then de-gassed by three repeated freeze-evacuate-thaw cycles and sealed in vacuum. The polymerization was carried out at 90° C. for 15 hours. The reaction mixture obtained was then diluted with 50 milliliters of dichloromethane (Sigma-Aldrich, St. Louis, Mo.) and precipitated in 0.8 liter of methanol (Sigma-Aldrich, St. Louis, Mo.). The polymer product collected by filtration was further purified by re-dissolving in 50 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours. GPC analysis of the obtained P(S-VN-VBCB)-b-PMMA block copolymer revealed: Mn=38, 600; Mw=61, 500; PDI=1.60.

Example 6

Synthesis of Poly(styrene-co-methacryloxymethyl-trimethylsilane)-b-poly(methyl methacrylate) Block Copolymers

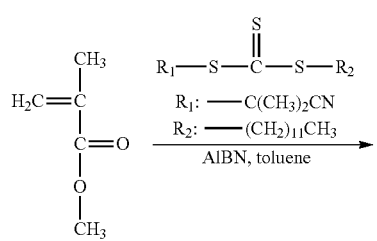

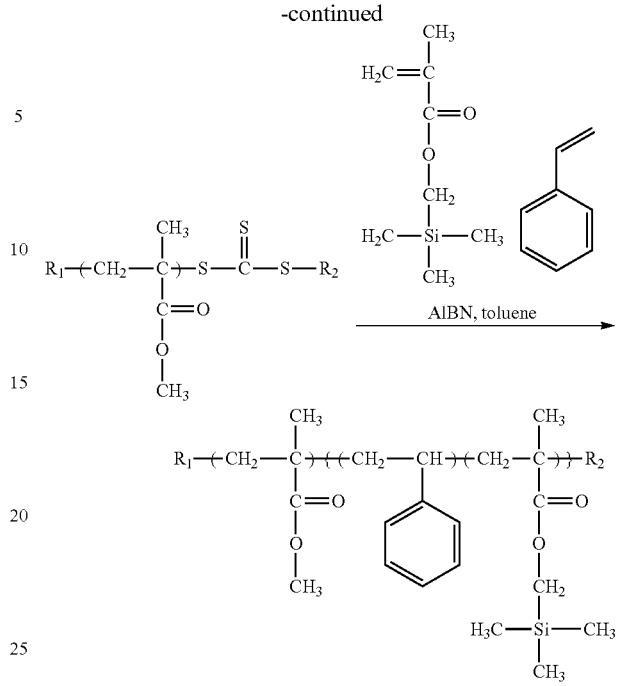

Synthesis of poly(styrene-co-methacryloxymethyltrimethylsilane)-b-poly(methyl methacrylate) (P(S-MASi)-b-PMMA)

The PMMA block was prepared first. A mixed solution of 279 milligrams of 2-cyano-2-propyl dodecyl trithiocarbonate (Sigma-Aldrich, St. Louis, Mo.), 28.7 grams of methyl methacrylate (Sigma-Aldrich, St. Louis, Mo.), and 28 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 32.4 milligrams of 2,2'-azobis(2-methylpropionitrile) (Sigma-Aldrich, St. Louis, Mo.) were added afterwards. The Schlenk reaction flask was de-gassed by three consecutive freeze-evacuate-thaw cycles and sealed in vacuum. The polymerization was carried out at 60° C. for 15 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. GPC analysis of the obtained PMMA with a trithiocarbonate end group revealed: Mn=22, 300; Mw=24, 800; PDI=1.11.

In the following reaction to prepare the P(S-MASi)-b-PMMA block copolymer, 3.30 grams of PMMA prepared above, 4.70 grams of styrene (Sigma-Aldrich, St. Louis, Mo.), 2.70 grams of methacryloxymethyltrimethylsilane (Gelest, Morrisville, Pa.), and 4.5 grams of toluene (Sigma-Aldrich, St. Louis, Mo.) were added into a Schlenk reaction flask and stirred at room temperature for 15 minutes. Next, 4.7 milligrams of 2,2'-azobis(2-methylpropionitrile) (Sigma-Aldrich, St. Louis, Mo.) were added. The Schlenk reaction flask was then de-gassed by three repeated freeze-evacuatethaw cycles and sealed in vacuum. The polymerization was carried out at 85° C. for 25 hours. The reaction mixture obtained was then diluted with 50 milliliters of dichloromethane (Sigma-Aldrich, St. Louis, Mo.) and precipitated in 0.8 liter methanol (Sigma-Aldrich, St. Louis, Mo.). The polymer product collected by filtration was further purified by re-dissolving in 50 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours. GPC analysis of the obtained P(S-MASi)-b-PMMA block copolymer revealed: Mn=36, 700; Mw=46, 600; PDI=1.27.

Example 7

Synthesis Poly(styrene-co-9-anthracene methyl methacrylate)-b-poly(methyl methacrylate) Block Copolymers

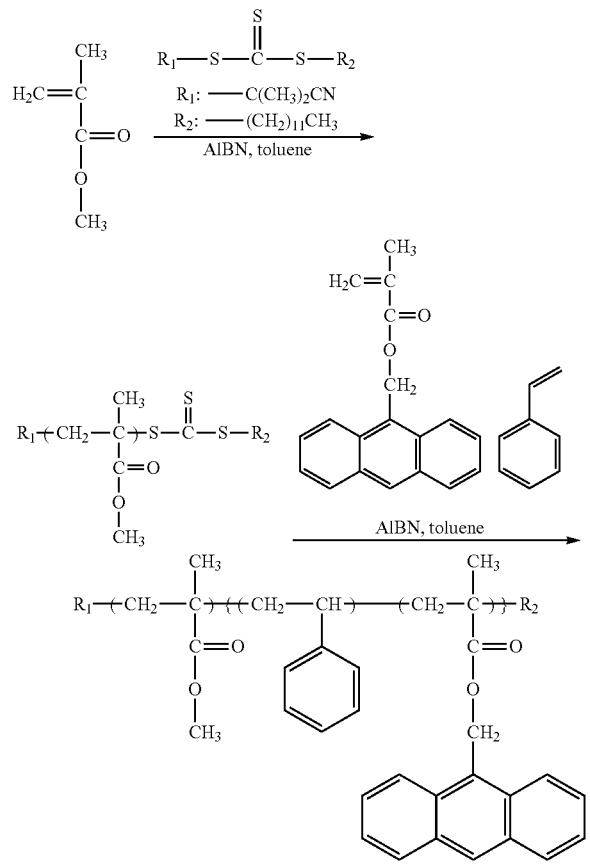

Synthesis of poly(styrene-co-9-anthracene methyl methacrylate)-b-poly(methyl methacrylate) (P(S-AMM)-b-PMMA)

The PMMA block was prepared first. A mixed solution of 518 milligrams of 2-cyano-2-propyl dodecyl trithiocarbonate (Sigma-Aldrich, St. Louis, Mo.), 40.0 grams of methyl methacrylate (Sigma-Aldrich, St. Louis, Mo.), and 28 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 27.4 milligrams of 2,2'-azobis(2-methylpropionitrile) (Sigma-Aldrich, St. Louis, Mo.) was added afterwards. The Schlenk reaction flask was de-gassed by three consecutive freeze-evacuate-thaw cycles and sealed in vacuum. The polymerization was carried out at 60° C. for 17 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. GPC analysis of the obtained PMMA with a trithiocarbonate end group revealed: Mn=15, 800; Mw=17, 500; PDI=1.11.

In the following reaction to prepare the P(S-AMM)-b-PMMA block copolymer, 3.15 grams of PMMA prepared above, 5.02 grams of styrene (Sigma-Aldrich, St. Louis, Mo.), 3.83 grams of 9-anthracene methyl methacrylate (Gelest, Morrisville, Pa.), and 3.0 grams of toluene (Sigma-Aldrich, St. Louis, Mo.) were added into a Schlenk reaction flask and stirred at room temperature for 15 minutes. Next, 3.8 milligrams of 2,2'-azobis(2-methylpropionitrile) (Sigma-Aldrich, St. Louis, Mo.) was added afterwards. The Schlenk reaction flask was then de-gassed by three repeated freeze-evacuate-thaw cycles and sealed in vacuum. The polymerization was carried out at 95° C. for 16 hours. The reaction mixture obtained was then diluted with 50 milliliters of dichloromethane (Sigma-Aldrich, St. Louis, Mo.) and precipitated in 0.8 liter methanol (Sigma-Aldrich, St. Louis, Mo.). The polymer product collected by filtration was further purified by re-dissolving in 50 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours. GPC analysis of the obtained P(S-AMM)-b-PMMA block copolymer revealed: Mn=22, 100; Mw=29, 500; PDI=1.34.

Example 8

P(S-VBCB)-b-PMMA Validation for Use in DSA

A tri-layer stack comprised of OptiStack® SOC110D-311 spin-on carbon (Brewer Science, Inc., Rolla, Mo.), a silicon hardmask, and the P(S-VBCB)-b-PMMA BCP synthesized in Example 3 was generated for testing successful directed self assembly.

On a Brewer Science® Cee® 100 spin coater, OptiStack® SOC110D-311 material was spin-coated onto two, 150-mm silicon wafers at a spin speed of 1,500 rpm for 30 seconds and baked on a hot plate at 230° C. for 60 seconds to yield a film thickness of about 110 nm. An experimental silicon hardmask that also functions as the neutral brush layer as taught in U.S. patent application Ser. No. 13/862,720 (previously incorporated by reference) was then coated on top of the SOC layer by spin-coating at 1,500 rpm for 30 seconds, followed by baking on a hot plate at 230° C. for 60 seconds to yield a film thickness of about 20-30 nm. One wafer was then coated with a PS-b-PMMA 25K molecular weight BCP (1% PS-b-PMMA in PGMEA solution, Polymer Source Inc., Quebec, Canada) by spin-coating at 1,500 rpm to give a target thickness of 26-28 nm. The second wafer was then coated with the P(S-co-VBCB)-b-PMMA from Example 3 to obtain identical thickness of 26-28 nm. A total stack of 56-58 nm thickness for combined NL HM and BCP was achieved on both wafers.

Once the BCP was coated on the wafers, an anneal of 230° C. for 5 minutes was performed on a hot plate in atmosphere.

Figure 4:
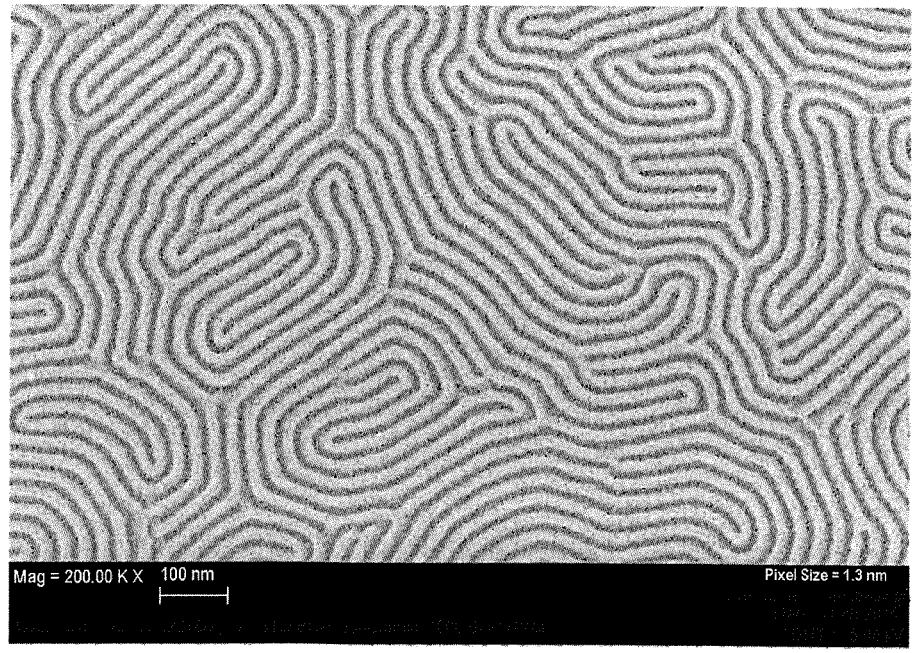
FIG. 4 is a scanning electron microscope (SEM) photograph showing the pattern formed in a prior art DSA composition, as described in Example 8.
Figure 5:
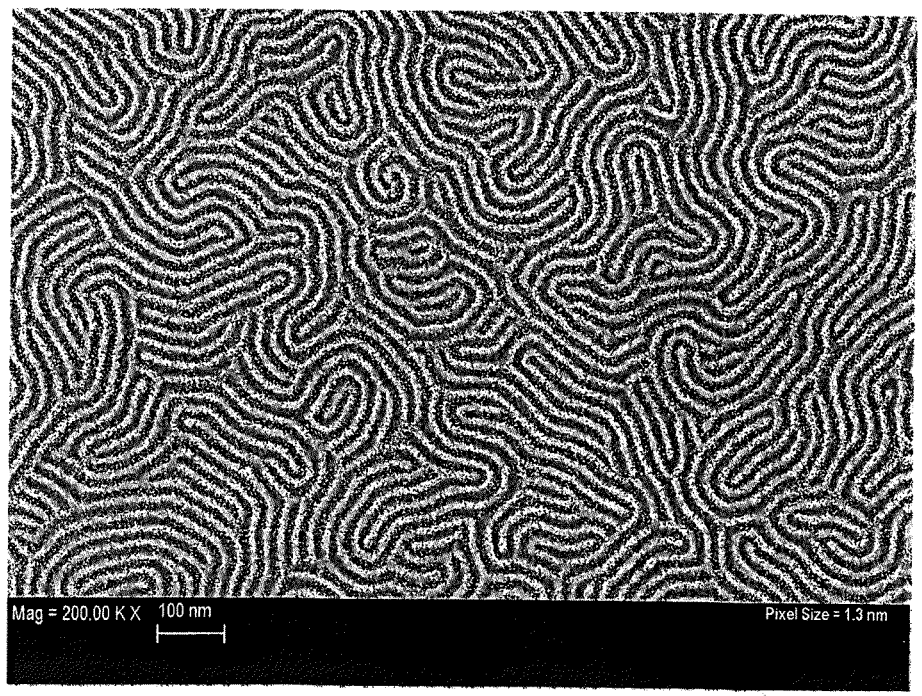
FIG. 5 is an SEM photograph showing the pattern formed in an inventive DSA composition, as described in Example 8.

The wafers were then subjected to an $O_2$ plasma etch at 100 Watts, 50 mTorr of vacuum, and 50 sccm of gas flow for 5 seconds to provide high contrast on the SEM. FIG. 4 shows the fingerprint pattern for standard BCP materials, and FIG. 5 shows the patterns formed in the P(S-VBCB)-b-PMMA BCP.

Example 9

Benefits of Crosslinked PS Block in BCP During Wet Etch

A tri-layer stack consisting of OptiStack® SOC110D-311 spin-on carbon, a silicon hardmask, and the P(S-VBCB)-b-PMMA BCP synthesized in Example 3 was generated for testing the durability of the crosslinked BCP during wet etch.

OptiStack® SOC110D-311 material was spin-coated onto two 300-mm silicon wafers to a thickness target of 100 nm and baked on a hot plate at 240° C. for 60 seconds. An experimental silicon hardmask that also functions as the neutral brush layer as taught in U.S. patent application Ser. No. 13/862,720 (previously incorporated by reference) was then coated on top of the SOC layer followed by baking on a hot plate at 240° C. for 60 seconds to yield a film thickness of about 20 nm. One wafer was then coated with a commercially available PS-b-PMMA BCP to give a target thickness of 36 nm. A thermal anneal at 250° C. for 5 minutes was performed on a hot plate under nitrogen atmosphere. The second wafer was then coated with the P(S-VBCB)-b-PMMA from Example 3 to obtain a thickness of 26 nm. Thermal anneal at 240° C. for 5 minutes was performed on a hot plate under nitrogen atmosphere.

Figure 6:
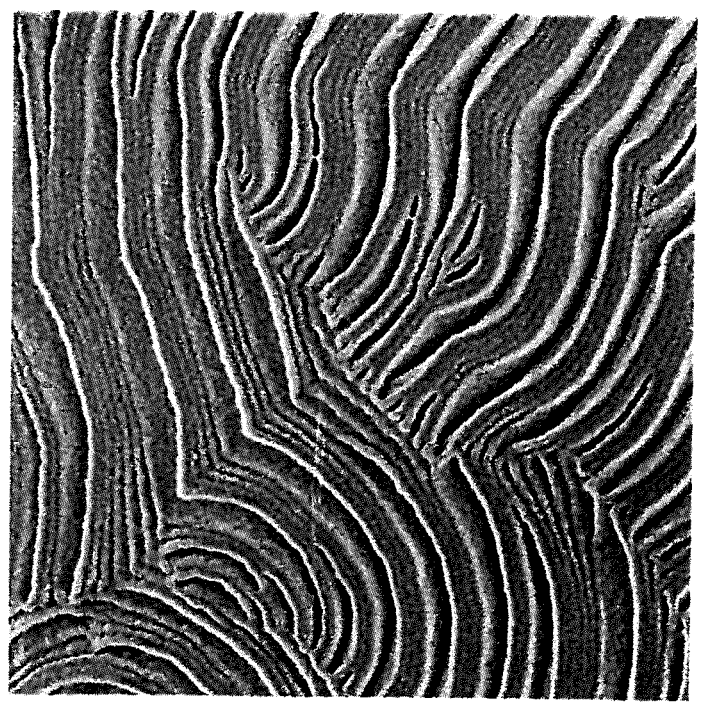
FIG. 6 is an SEM photograph showing pattern collapse after wet etching of a pattern formed from a prior art DSA composition, as described in Example 9.
Figure 7:
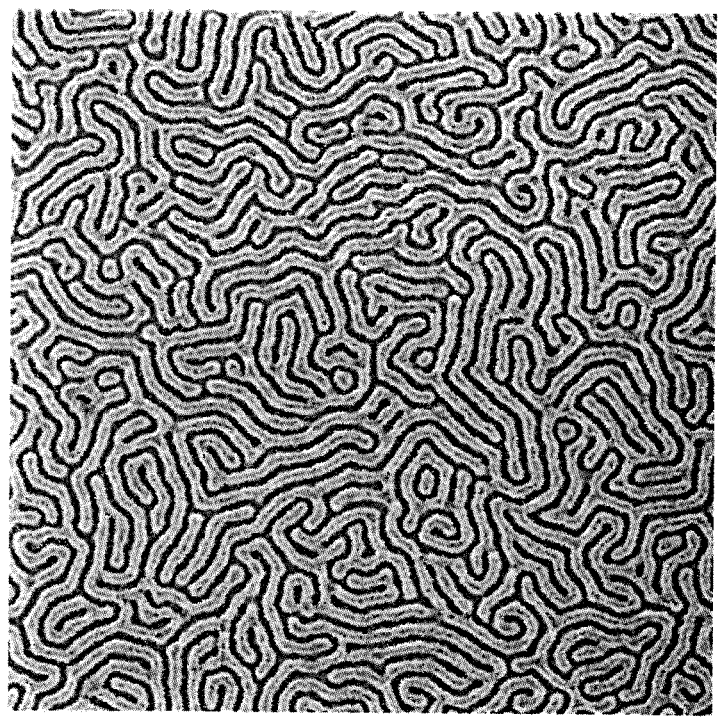
FIG. 7 is an SEM photograph showing, after wet etching, the still-standing pattern formed using an inventive DSA composition, as described in Example 9.

Both wafers were then passed through a wet etch module in a TEL ACT12 track using a proprietary wet etch process to develop the BCP. FIG. 6 shows the fingerprint pattern for standard BCP materials, and FIG. 7 shows the patterns formed in the P(S-VBCB)-b-PMMA BCP. These figures show that the crosslinked P(S-VBCB)-b-PMMA BCP lines remained standing while the standard BCP lines collapsed.

We claim:

1. A method of forming a microelectronic structure, said method comprising:
   providing a stack comprising:
      a substrate having a surface; and
      one or more optional intermediate layers on said substrate surface;
   applying a composition to said intermediate layers, if present, or to said substrate surface, if no intermediate layers are present, said composition comprising a block copolymer comprising a first block and a second block, each having respective etch rates, said first block comprising:
      a precursor monomer having an etch rate that is slower than said second block etch rate; and
      at least one etch-adjusting monomer, said first block having an etch rate that is slower than said precursor monomer etch rate; and
   causing said composition to self-assemble into a self-assembled layer, wherein said self-assembled layer comprises a first self-assembled region and a second self-assembled region different from said first self-assembled region.

2. The method of claim 1, wherein said precursor monomer is selected from the group consisting of styrene, 2-vinylpyridine, 4-vinylpyridine, 4-tert-butyl styrene, and 4-vinylanisole.

3. The method of claim 1, wherein said etch-adjusting monomer is selected from the group consisting of vinylbenzocyclobutene, 1-vinylnaphthalate, 2-vinylnapthalate, 2-vinylanthracene, 9-vinylanthracene, 9-vinylphenanthrene, 4-trimethylsilylstyrene, and combinations thereof.

4. The method of claim 1, wherein said second block is a polymer comprising monomers selected from the group consisting of methyl methacrylate, lactic acid, ethylene oxide, methyl acrylate, vinyl ester, and vinyl amide.

5. The method of claim 1, wherein said second block has an etch rate that is at least about twice the etch rate of the first block.

6. The method of claim 1, wherein said second block has an etch rate that is at least about 1.5 times faster than the etch rate of the precursor monomer.

7. The method of claim 1, wherein said precursor monomer has an etch rate that is at least about 1.1 times faster than the etch rate of the first block.

8. The method of claim 1, wherein said precursor monomer is styrene, and said etch-adjusting monomer is selected from the group consisting of vinylbenzocyclobutene, 1-vinylnaphthalate, 2-vinylnapthalate, 2-vinylanthracene, 9-vinylanthracene, 9-vinylphenanthrene, 4-trimethylsilylstyrene, and combinations thereof.

9. The method of claim 8, wherein said second block is poly(methyl methacrylate).

10. The method of claim 1, wherein said causing comprises heating said composition to at least about the glass transition temperature of said block copolymer, said self-assembling occurring during said heating.

11. The method of claim 10, wherein said precursor monomer is styrene, and said etch-adjusting monomer self-crosslinks during said heating.

12. The method of claim 1, wherein said stack comprises an intermediate layer selected from the group consisting of bottom anti-reflective coatings, neutral brush layers, hardmask neutral layers, hardmasks, spin-on carbon layers, etch block layers, and imaging layers.

13. The method of claim 1, wherein said substrate is a semiconductor substrate.

14. The method of claim 13, wherein said substrate is selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing.

15. The method of claim 1, further comprising removing said second self-assembled region to yield a pattern in said self-assembled layer.

16. The method of claim 15, further comprising transferring said pattern into said one or more intermediate layers, if present, and into said substrate, wherein said pattern comprises a plurality of features selected from the group consisting of trenches, spaces, via holes, contact holes having an average feature size of less than about 30 nm.

17. The method of claim 1, wherein an intermediate layer is present, said intermediate layer comprising a pre-pattern comprising a plurality of raised features, said raised features being spaced apart and each being defined by respective sidewalls and a top surface, wherein said self-assembling composition is applied directly on top of said intermediate layer in spaces between said raised features.

18. The method of claim 17, wherein said plurality of raised features are formed by:
   applying a photosensitive composition to form an imaging layer on an intermediate layer other than said intermediate layer comprising said pre-pattern, if present, or on said substrate surface, if no said intermediate layer other than said intermediate layer comprising said pre-pattern is present; and patterning said imaging layer to yield said pre-pattern, before applying said composition to said imaging layer.

19. The method of claim 18, wherein said patterning comprises:
exposing said imaging layer to radiation to yield exposed and unexposed portions of said imaging layer; and
contacting said imaging layer with a developer so as to remove one of said exposed or unexposed portions.

20. The method of claim 1, wherein at least one intermediate layer is present, said intermediate layer being selected from the group consisting of hardmask layers and neutral layers, and wherein said intermediate layer comprises a surface having surface-modified regions and non-modified regions, said first and second self-assembled regions being adjacent said non-modified regions.

21. The method of claim 20, wherein, before applying said composition to said intermediate layer, said surface-modified regions and non-modified are formed by:
forming an imaging layer on said intermediate layer; and
patterning said imaging layer to yield a pre-pattern, wherein said patterning comprises selectively removing portions of said imaging layer to uncover portions of said intermediate layer;
contacting said uncovered portions of intermediate layer with a developer or solvent to yield said surface-modified regions; and
removing remaining portions of said imaging layer from said intermediate layer to yield said non-modified regions.

22. The method of claim 1, wherein said block copolymer is dissolved or dispersed in a solvent system.

23. The method of claim 1, wherein said causing is carried out after said applying and without a further layer being formed on said composition or a second composition being applied to said composition.

24. A microelectronic structure comprising:
a substrate having a surface;
one or more optional intermediate layers on said substrate surface; and
a layer of a self-assembling composition formed on said one or more optional intermediate layers, if present, or on said substrate surface, if no intermediate layers are present, said self-assembling composition comprising a block copolymer dissolved or dispersed in a solvent system, said block copolymer comprising:
a first block having an etch rate and comprising:
a precursor monomer having an etch rate; and
at least one etch-adjusting monomer, said first block having an etch rate that is slower than said precursor monomer etch rate; and
a second block having an etch rate, said precursor monomer etch rate being slower than said second block etch rate.

25. The structure of claim 24, wherein said precursor monomer is selected from the group consisting of styrene, 2-vinylpyridine, 4-vinylpyridine, 4-tert-butyl styrene, and 4-vinylanisole.

26. The structure of claim 24, wherein said etch-adjusting monomer is selected from the group consisting of vinylbenzocyclobutene, 1-vinylnaphthalate, 2-vinylnapthalate, 2-vinylanthracene, 9-vinylanthracene, 9-vinylphenanthrene, 4-trimethylsilylstyrene, and combinations thereof.

27. The structure of claim 24, wherein said second block is a polymer comprising monomers selected from the group consisting of methyl methacrylate, lactic acid, ethylene oxide, methyl acrylate, vinyl ester, and vinyl amide.

28. The structure of claim 24, wherein said second block has an etch rate that is at least about twice the etch rate of the first block.

29. The structure of claim 24, wherein said second block has an etch rate that is at least about 1.5 times faster than the etch rate of the precursor monomer.

30. The structure of claim 24, wherein said precursor monomer has an etch rate that is at least about 1.1 times faster than the etch rate of the first block.

31. The structure of claim 24, wherein said precursor monomer is styrene, and said etch-adjusting monomer is selected from the group consisting of vinylbenzocyclobutene, 1-vinylnaphthalate, 2-vinylnapthalate, 2-vinylanthracene, 9-vinylanthracene, 9-vinylphenanthrene, 4-trimethylsilylstyrene, and combinations thereof.

32. The structure of claim 31, wherein said second block is poly(methyl methacrylate).

33. The structure of claim 24, wherein said stack comprises an intermediate layer selected from the group consisting of bottom anti-reflective coatings, neutral brush layers, hardmask neutral layers, hardmasks, spin-on carbon layers, etch block layers, and imaging layers.

34. The structure of claim 24, wherein said substrate is a semiconductor substrate.

35. The structure of claim 34, wherein said substrate is selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing.

36. The structure of claim 24, wherein an intermediate layer is present, said intermediate layer comprising a pre-pattern comprising a plurality of raised features, said raised features being spaced apart and each being defined by respective sidewalls and a top surface, wherein said self-assembling composition is applied directly on top of said intermediate layer in spaces between said raised features.

37. A microelectronic structure comprising:
a substrate having a surface;
one or more optional intermediate layers on said substrate surface; and
a self-assembled layer formed on said optional intermediate layers, if present, or on said substrate surface, if no intermediate layers are present, said self-assembled layer comprising:
a first self-assembled region comprising a first block of a block copolymer, said first block having an etch rate and comprising:
a precursor monomer having an etch rate; and
at least one etch-adjusting monomer, said first block having an etch rate that is slower than said precursor monomer etch rate; and
a second self-assembled region different from said first self-assembled region, and comprising a second block of said block copolymer, said second block having an etch rate, said precursor monomer etch rate being slower than said second block etch rate.

38. The structure of claim 37, wherein said precursor monomer is selected from the group consisting of styrene, 2-vinylpyridine, 4-vinylpyridine, 4-tert-butyl styrene, and 4-vinylanisole.

39. The structure of claim 37, wherein said etch-adjusting monomer is selected from the group consisting of vinylbenzocyclobutene, 1-vinylnaphthalate, 2-vinylnapthalate, 2-vinylanthracene, 9-vinylanthracene, 9-vinylphenanthrene, 4-trimethylsilylstyrene, and combinations thereof.

40. The structure of claim 37, wherein said second block is a polymer comprising monomers selected from the group consisting of methyl methacrylate, lactic acid, ethylene oxide, methyl acrylate, vinyl ester, and vinyl amide.

41. The structure of claim 37, wherein said second block has an etch rate that is at least about twice the etch rate of the first block.

42. The structure of claim 37, wherein said second block has an etch rate that is at least about 1.5 times faster than the etch rate of the precursor monomer.

43. The structure of claim 37, wherein said precursor monomer has an etch rate that is at least about 1.1 times faster than the etch rate of the first block.

44. The structure of claim 37, wherein said precursor monomer is styrene, and said etch-adjusting monomer is selected from the group consisting of vinylbenzocyclobutene, 1-vinylnaphthalate, 2-vinylnapthalate, 2-vinylanthracene, 9-vinylanthracene, 9-vinylphenanthrene, 4-trimethylsilylstyrene, and combinations thereof.

45. The structure of claim 37, wherein said second block is poly(methyl methacrylate).

46. The structure of claim 37, wherein said precursor monomer is styrene, and said etch-adjusting monomer is self-crosslinked in said first block.

47. The structure of claim 37, wherein said stack comprises an intermediate layer selected from the group consisting of bottom anti-reflective coatings, neutral brush layers, hardmask neutral layers, hardmasks, spin-on carbon layers, etch block layers, and imaging layers.

48. The structure of claim 37, wherein said substrate is a semiconductor substrate.

49. The structure of claim 48, wherein said substrate is selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing.

50. The structure of claim 37, wherein an intermediate layer is present and comprises a pre-pattern comprising a plurality of raised features, said raised features being spaced apart and each being defined by respective sidewalls and a top surface, wherein said self-assembled layer is formed on said intermediate layer in spaces between said raised features.

51. A block copolymer comprising:
a first block comprising:
a monomer selected from the group consisting of styrene, 2-vinylpyridine, 4-vinylpyridine, 4-tert-butyl styrene, and 4-vinylanisole; and
at least one etch-adjusting monomer selected from the group consisting of vinylbenzocyclobutene, 1-vinylnaphthalate, 2-vinylnapthalate, 2-vinylanthracene, 9-vinylanthracene, 9-vinylphenanthrene, 4-trimethylsilylstyrene, and combinations thereof; and
a second block comprising a monomer selected from the group consisting of methyl methacrylate, lactic acid, ethylene oxide, methyl acrylate, vinyl ester, and vinyl amide.

52. A composition comprising a block copolymer dissolved or dispersed in a solvent system, said block copolymer comprising:
a first block comprising:
a monomer selected from the group consisting of styrene, 2-vinylpyridine, 4-vinylpyridine, 4-tert-butyl styrene, and 4-vinylanisole; and
at least one etch-adjusting monomer selected from the group consisting of vinylbenzocyclobutene, 1-vinylnaphthalate, 2-vinylnapthalate, 2-vinylanthracene, 9-vinylanthracene, 9-vinylphenanthrene, 4-trimethylsilylstyrene, and combinations thereof; and
a second block comprising a monomer selected from the group consisting of methyl methacrylate, lactic acid, ethylene oxide, methyl acrylate, vinyl ester, and vinyl amide.

53. The composition of claim 52, wherein said solvent system is selected from the group consisting of propylene glycol monomethyl ether, propylene glycol monomethyl ether acetate, gamma-butyrolactone, cyclohexanone, cyclopentanone, ethyl lactate, ethylacetoacetate, n-butyl acetate, methyl isobutyl carbinol, 2-heptanone, isopropyl alcohol, methyl ethyl ketone, and mixtures thereof.

* * * * *